United States Patent
Tang et al.

(10) Patent No.: US 7,781,832 B2
(45) Date of Patent: Aug. 24, 2010

(54) TRENCH-TYPE POWER MOS TRANSISTOR AND INTEGRATED CIRCUIT UTILIZING THE SAME

(75) Inventors: Ming Tang, Hsinchu (TW); Shih-Ping Chiao, Hsinchu (TW)

(73) Assignee: PTEK Technology Co., Ltd., Hsinchu (TW)

( * ) Notice: Subject to any disclaimer, the term of this patent is extended or adjusted under 35 U.S.C. 154(b) by 244 days.

(21) Appl. No.: 12/128,452

(22) Filed: May 28, 2008

(65) Prior Publication Data

US 2009/0294846 A1    Dec. 3, 2009

(51) Int. Cl.
*H01L 29/732*    (2006.01)

(52) U.S. Cl. ................. 257/334; 257/330; 257/E29.262

(58) Field of Classification Search ................. 257/330, 257/334, E29.262
See application file for complete search history.

(56) References Cited

U.S. PATENT DOCUMENTS

| | | | |
|---|---|---|---|
| 4,300,150 A | | 11/1981 | Colak |
| 5,293,053 A | * | 3/1994 | Malhi et al. ............. 257/330 |
| 6,613,622 B1 | | 9/2003 | Nair et al. |
| 6,679,621 B2 | | 1/2004 | West et al. |
| 6,781,197 B2 | | 8/2004 | Fujishima et al. |
| 6,858,500 B2 | * | 2/2005 | Sugi et al. ............. 438/270 |
| 6,879,005 B2 | | 4/2005 | Yamaguchi et al. |
| 7,033,891 B2 | | 4/2006 | Wilson et al. |
| 7,135,738 B2 | * | 11/2006 | Williams et al. ............. 257/328 |
| 7,344,935 B2 | | 3/2008 | Fujishima et al. |
| 7,345,341 B2 | | 3/2008 | Lin et al. |
| 7,352,036 B2 | | 4/2008 | Grebs et al. |
| 7,359,250 B2 | * | 4/2008 | Ogura et al. ............ 365/185.28 |
| 7,365,392 B2 | | 4/2008 | Sugi et al. |
| 7,368,785 B2 | | 5/2008 | Chen et al. |
| 2003/0164527 A1 | * | 9/2003 | Sugi et al. .................... 257/401 |
| 2008/0067584 A1 | | 3/2008 | Lui et al. |
| 2008/0093667 A1 | | 4/2008 | Shibib et al. |
| 2008/0099783 A1 | | 5/2008 | Fukamizu et al. |
| 2008/0116510 A1 | | 5/2008 | Kocon et al. |
| 2008/0303087 A1 | * | 12/2008 | Sugi et al. .................... 257/334 |

FOREIGN PATENT DOCUMENTS

TW    200711126    3/2007

* cited by examiner

*Primary Examiner*—Allan R Wilson
(74) *Attorney, Agent, or Firm*—WPAT, P.C.; Anthony King (57) ABSTRACT

A power MOS transistor comprises a drain region, a trench gate, a source region, a well region, a deep well region and a substrate region. The drain region has a doping region of a first conductivity type connected to a drain electrode. The trench gate has an insulating layer and extends into the drain region. The source region has a doping region of the first conductivity type connected to a source electrode. The well region is doped with a second conductivity type, formed under the source region, and connected to the source electrode. The deep well region is doped with the first conductivity type and is formed under the drain region and the well region. The substrate region is doped with the second conductivity type and is formed under the deep well region. The drain region is formed at one side of the trench gate and the source region is formed at the opposing side of the trench gate such that the trench gate laterally connects the source region and the drain region.

14 Claims, 11 Drawing Sheets

FIG. 13 ically in a VDMOS transistor. As shown in FIG. 1, the source region

TRENCH-TYPE POWER MOS TRANSISTOR AND INTEGRATED CIRCUIT UTILIZING THE SAME

BACKGROUND OF THE INVENTION (A) Field of the Invention

The present invention relates to a MOS transistor, and more particularly, to a trench-type and planer-structured power MOS transistor.

(B) Description of the Related Art

Power MOS transistors are a specific type of MOS transistor used for providing and switching power in an integrated circuit. Accordingly, power MOS transistors must be able to work normally under high voltage. Therefore, it is typical for a power MOS transistor cell manufactured by CMOS process to be of a large size, usually 5 to 10 times the size of a standard CMOS transistor, in order to be capable of operation under high voltage. On the other hand, it is also a requirement that power MOS transistors be able to output large current. Therefore, it is typical to combine a large number of power MOS transistor cells into a single power MOS transistor, wherein each power MOS transistor cell outputs a relatively small amount of current. However, such a power MOS transistor must be very large, which may be unacceptable in view of manufacturing requirements nowadays.

Figure 1:
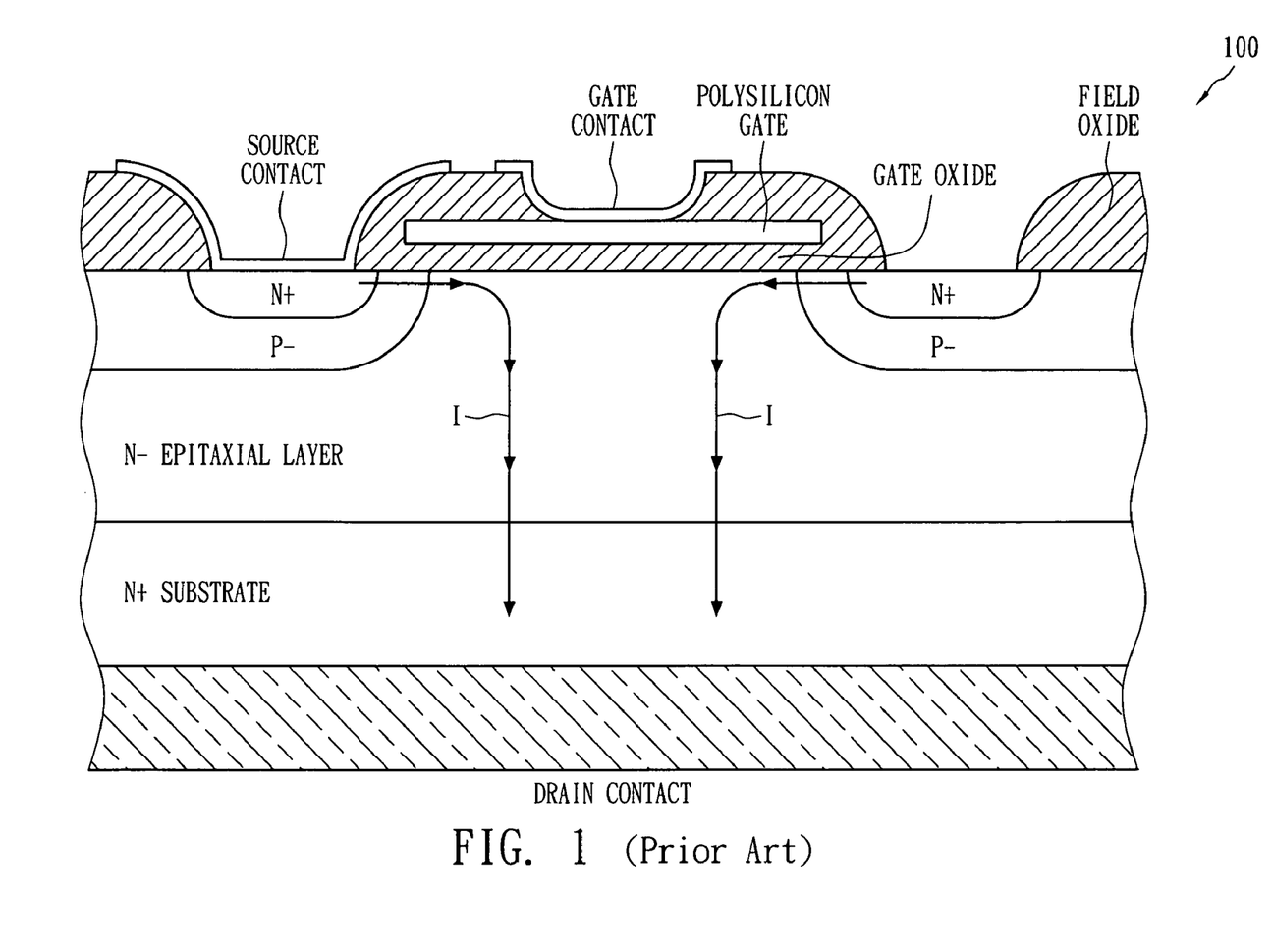
FIG. 1 shows a prior schematic view of a VDMOS transistor.

To reduce the size of power MOS transistors, a vertical diffused MOS (VDMOS) transistor is introduced. FIG. 1 shows a schematic view of a VDMOS transistor. Unlike traditional planar CMOS transistors, the current flows vertically in a VDMOS transistor. As shown in FIG. 1, the source region is on the top of the VDMOS transistor 100, and the drain region is on the bottom of the VDMOS transistor 100. Such structure enables the VDMOS transistor 100 both a high breakdown voltage and a high current output. However, a JFET effect emerges when scaling down VDMOS transistors that increases the resistance of VDMOS transistors.

Figure 2:
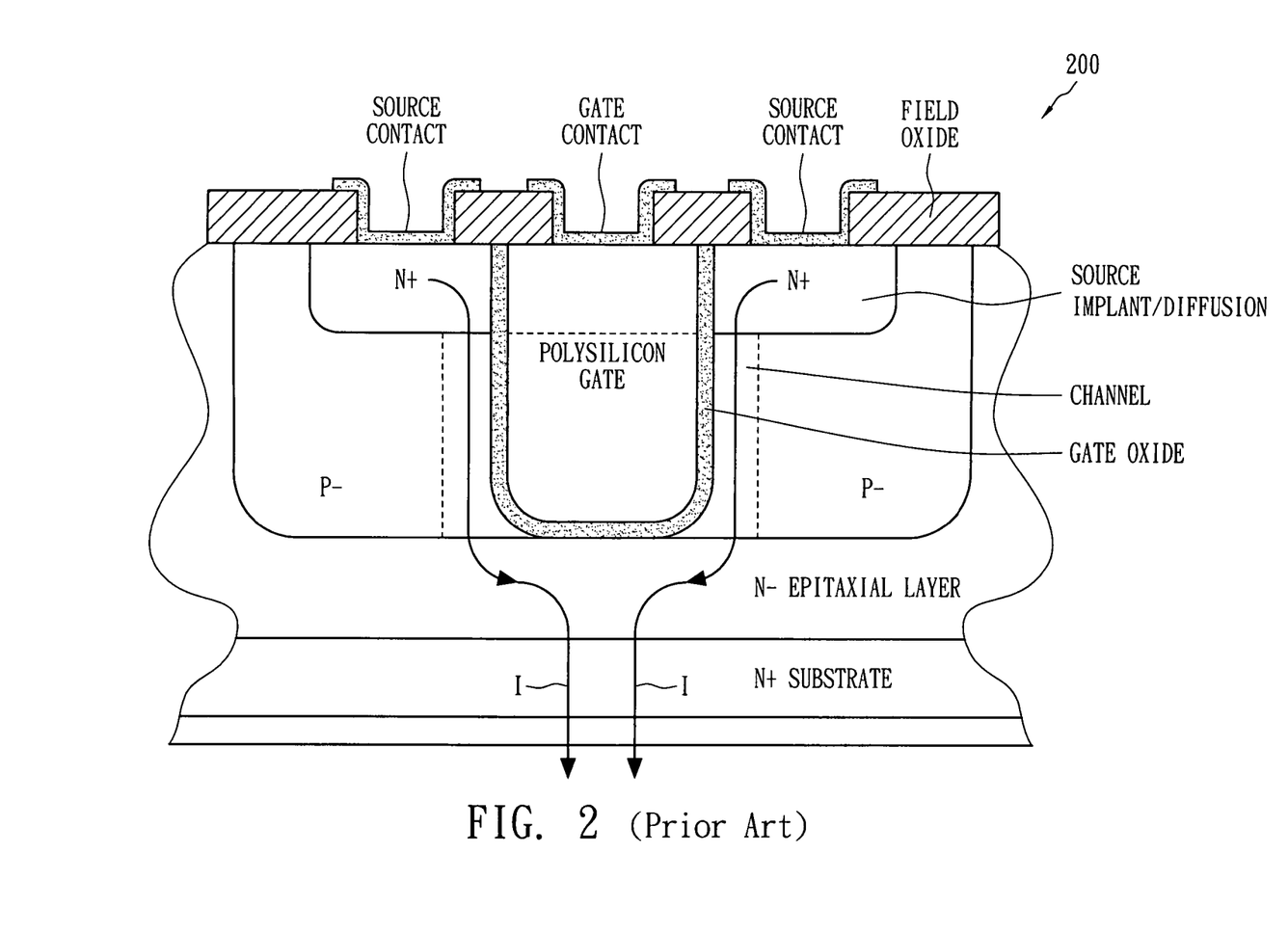
FIG. 2 shows a prior schematic view of a UMOS transistor.

To solve the JFET effect problem, a trench gate MOS transistor, also referred as a UMOS transistor, is introduced. FIG. 2 shows a schematic view of a UMOS transistor. The name "UMOS" derives from the U-shaped gate oxide of the UMOS transistor 200. As shown in FIG. 2, the UMOS transistor 200 has a trench-shaped gate extending into the silicon. Such structure effectively solves the JFET effect problem. However, since most UMOS transistors comprise an epitaxial layer, when scaling down UMOS transistors, the resistance of the epitaxial layer will increase as well. Therefore, the current increase gained by scaling down UMOS transistors is almost completely offset by the current decrease due to the increased resistance of the epitaxial layer.

On the other hand, since VDMOS and UMOS transistors both adopt a vertical structure, they cannot be manufactured or even integrated with other logic circuits on a CMOS-processed chip. Therefore, there is a need to design a power MOS transistor that can maintain a high breakdown voltage, be of a small size, and can still be implemented on a CMOS processed chip.

SUMMARY OF THE INVENTION

The MOS transistor according to one embodiment of the present invention comprises a drain region, a trench gate, a source region, a well region, a deep well region and a substrate region. The drain region has a doping region of a first conductivity type connected to a drain electrode. The trench gate has an asymmetric insulating layer and extends into the drain region. The source region has a doping region of the first conductivity type connected to a source electrode. The well region is doped with a second conductivity type, formed under the source region and connected to the source electrode. The deep well region is doped with the first conductivity type and is formed under the drain region and the well region. The substrate region is doped with the second conductivity type and is formed under the deep well region. The drain region is formed at one side of the trench gate and the source region is formed at the opposing side of the trench gate such that the trench gate laterally connects the source region and the drain region.

The MOS transistor according to another embodiment of the present invention comprises a drain region, a trench gate, a source region, a well region and a substrate region. The drain region has a doping region of a first conductivity type connected to a drain electrode. The trench gate has an asymmetric insulating layer and extends into the drain region. The source region has a doping region of the first conductivity type connected to a source electrode. The well region is doped with a second conductivity type, formed under the source region and connected to the source electrode. The substrate region is doped with the second conductivity type and is formed under the well region and the drain region. The drain region is formed at one side of the trench gate and the source region is formed at the opposing side of the trench gate such that the trench gate laterally connects the source region and the drain region.

The integrated circuit according to the one embodiment of the present invention comprises a power MOS transistor and a controller circuit. The power MOS transistors provide power input and output for the controller circuit.

BRIEF DESCRIPTION OF THE DRAWINGS

The objectives and advantages of the present invention will become apparent upon reading the following description and upon reference to the accompanying drawings in which.

DETAILED DESCRIPTION OF THE INVENTION

Figure 3:
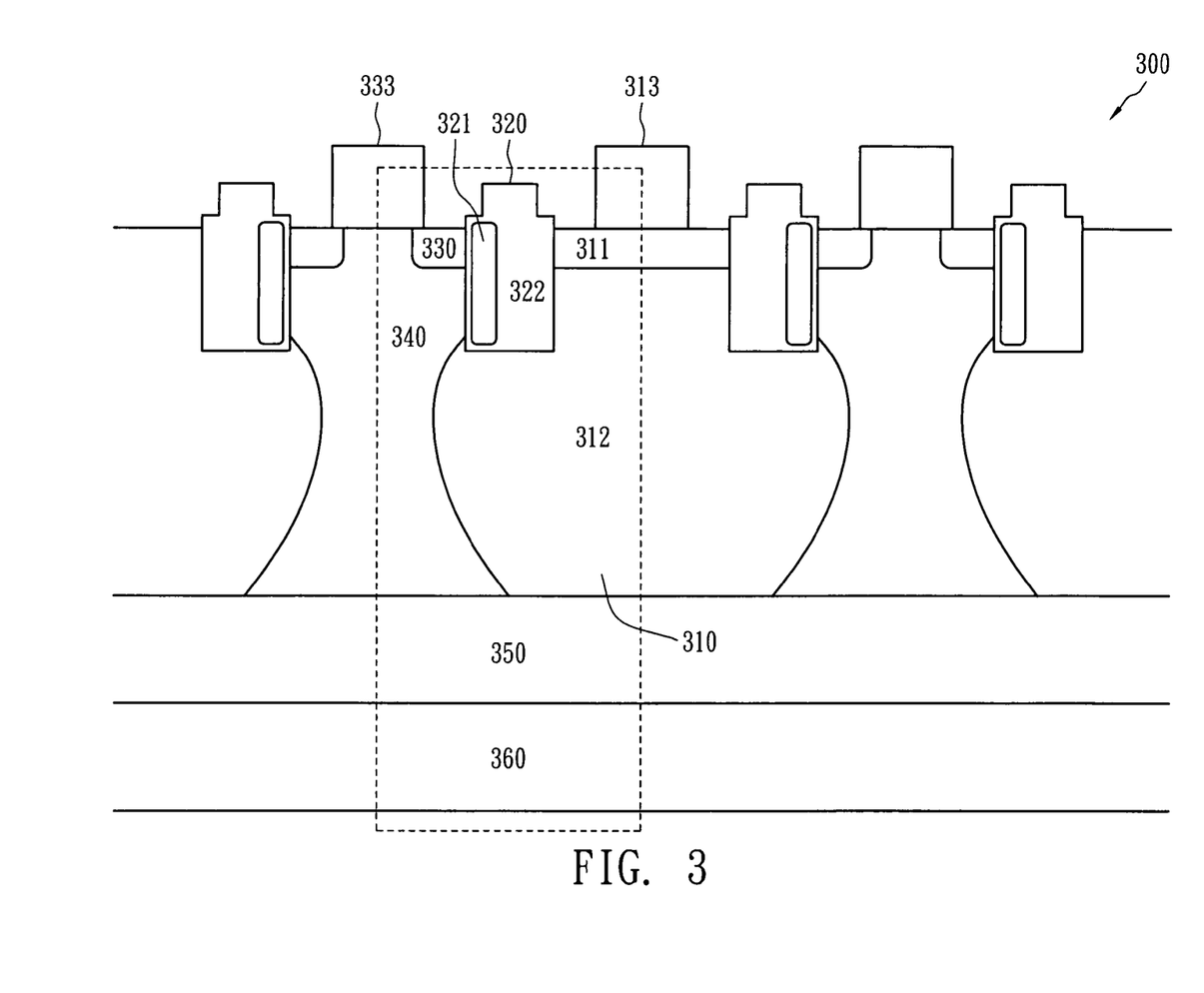
FIG. 3 shows a schematic view of an embodiment of the MOS transistor of the present invention.

FIG. 3 shows a schematic view of the power MOS transistor according to one embodiment of the present invention.

The power MOS transistor 300 comprises a drain region 310, a trench gate 320, a source region 330, a well region 340, a deep well region 350 and a substrate region 360. The power MOS transistor 300 shown in FIG. 3 is an N-type power MOS transistor. However, it can easily be adapted into a P-type power MOS transistor by those skilled in the art. The drain region 310 has an N+ doping region connected to a drain electrode 313. Preferably, the drain region 310 has a double diffused drain structure with an N+ doping region 311 and an N− doping region 312 such that the doping concentration of the drain region 310 closer to the deep well region 350 is lower than the doping concentration of the drain region 310 farther from the deep well region 350. The trench gate 320 with an asymmetric insulating layer and extending into the drain region 310 comprises a poly gate 321 surrounded by a field oxide 322. The source region 330 has an N+ doping region connected to a source electrode 333. The well region 340 is P+ doped, formed under the source region 330 and connected to the source electrode 333. The deep well region 350 is N+ doped and formed under the drain region 310 and the well region 340. The substrate region 360 is P+ doped and formed under the deep well region 350.

Figure 4:
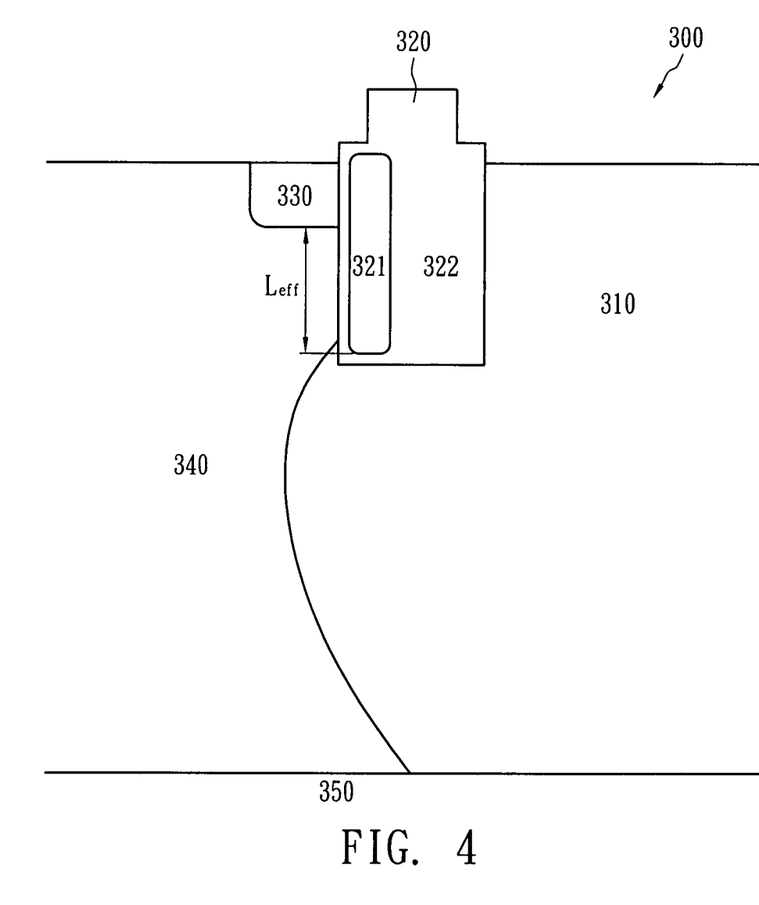
FIG. 4 shows a schematic view of an embodiment of the MOS transistor of the present invention.

FIG. 4 shows a partially enlarged view of the power MOS transistor 300 in FIG. 3. When the power MOS transistor 300 is turned on, a channel is formed from the drain region 310 along the sidewall of the trench gate 320 to the source region 330. The effective channel $L_{eff}$, which is a vertical channel along the sidewall of the trench gate 320 connecting the source region 330, is indicated in FIG. 4. Such effective channel $L_{eff}$ could be very short, and hence enhance the current flowing therethrough. The insulating layer of the trench gate 320 connecting the drain region 310 is much thicker than the insulating layer connecting the source region 330. Such thick insulating layer, or field oxide 322, not only provides a high drain-to-gate breakdown voltage, but also provides a more robust operation under a high drain-to-gate voltage.

On the other hand, the trench gate 320 provides a high drain-to-source breakdown voltage. As shown in FIG. 4, the drain-to-source breakdown voltage of the power MOS transistor 300 is closely related to the channel length in FIG. 4. In other words, as the channel length increases, the localized electric field becomes small, and hence the drain-to-source breakdown voltage becomes higher. Therefore, increasing either the width or the depth of the trench gate 320 will increase the drain-to-source breakdown voltage of the power MOS transistor 300.

Figure 5:
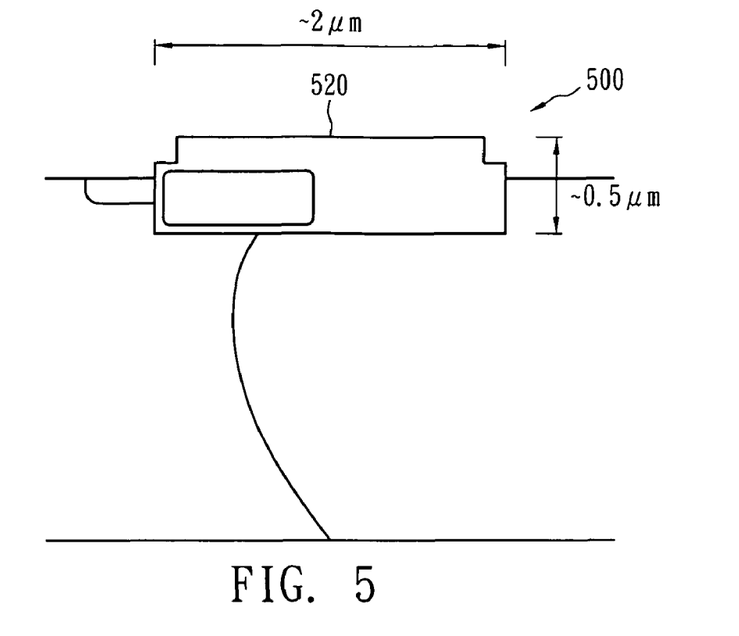
FIG. 5 shows a schematic view of an embodiment of the MOS transistor of the present invention.

FIG. 5 shows a schematic view of the power MOS transistor according to another embodiment of the present invention. The depth of the trench gate 520 of the power MOS transistor 500 is about 0.5 micrometer. The width of the trench gate 520 of the power MOS transistor 500 is about 2 micrometers. The drain-to-source breakdown voltage of the power MOS transistor 500 is about 50V.

Figure 6:
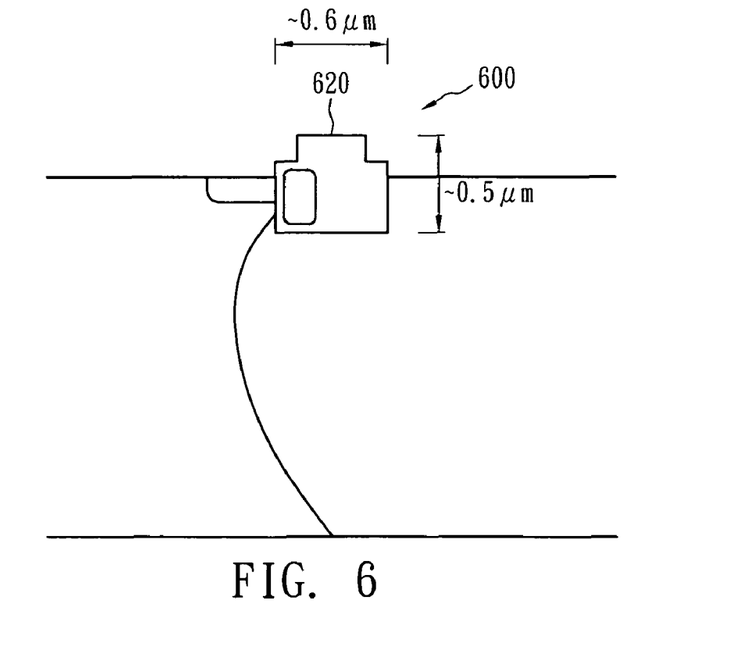
FIG. 6 shows a schematic view of an embodiment of the MOS transistor of the present invention.

FIG. 6 shows a schematic view of the power MOS transistor according to another embodiment of the present invention. The depth of the trench gate 620 of the power MOS transistor 600 is the same as the depth of the trench gate 520 of the power MOS transistor 500, while the width of the trench gate 620 is about 0.6 micrometer. The drain-to-source breakdown voltage of the power MOS transistor 500 is about 20V.

Figure 7:
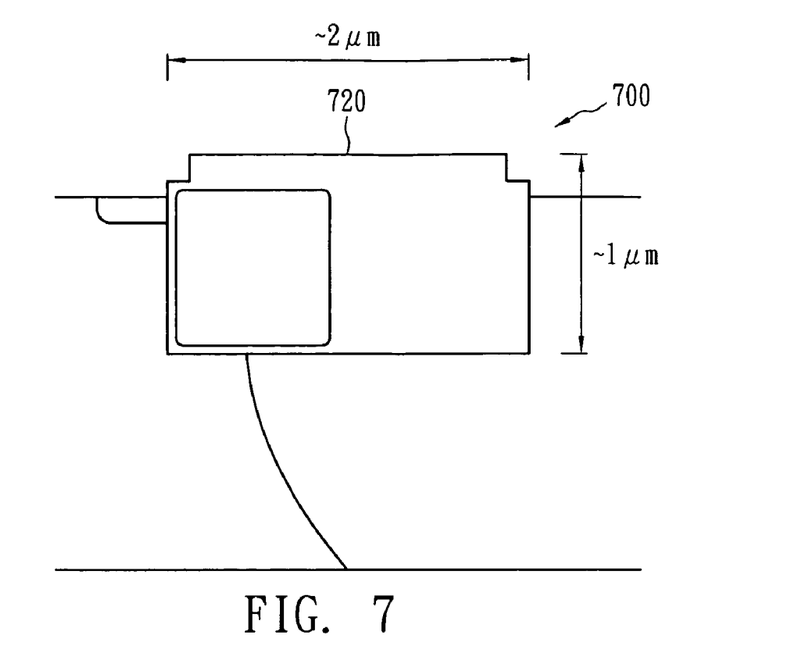
FIG. 7 shows a schematic view of an embodiment of the MOS transistor of the present invention.

FIG. 7 shows a schematic view of the power MOS transistor according to another embodiment of the present invention. The depth of the trench gate 720 of the power MOS transistor 700 is about 1 micrometer. The width of the trench gate 720 of the power MOS transistor 700 is about 2 micrometer. The drain-to-source breakdown voltage of the power MOS transistor 700 is about 70V.

Figure 8:
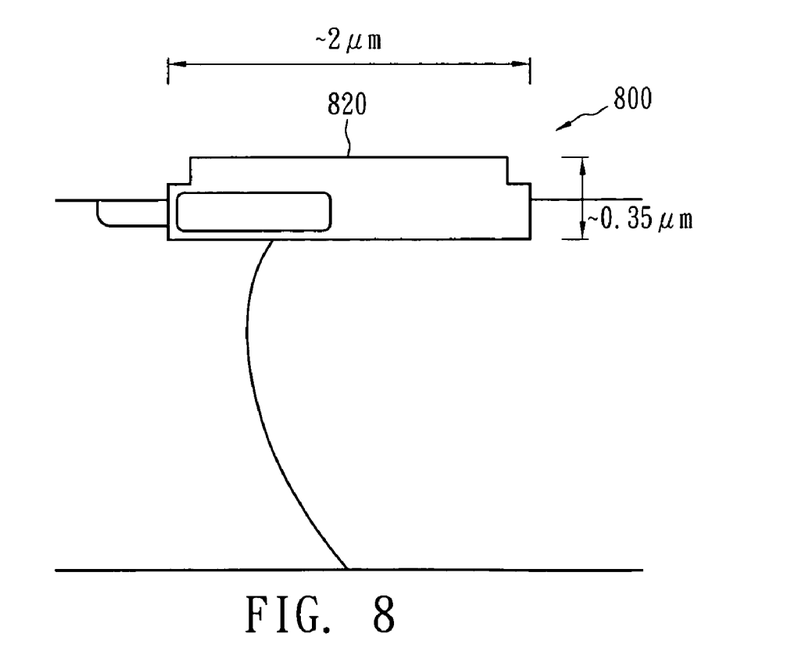
FIG. 8 shows a schematic view of an embodiment of the MOS transistor of the present invention.

FIG. 8 shows a schematic view of the power MOS transistor according to another embodiment of the present invention. The width of the trench gate 820 of the power MOS transistor 800 is the same as the width of the trench gate 720 of the power MOS transistor 700, while the depth of the trench gate 820 of the power MOS transistor 800 is about 0.35 micrometer. The drain-to-source breakdown voltage of the power MOS transistor 800 is about 50V.

Referring to FIG. 3, the drain region 310 of a double diffused drain structure also provides a high drain-to-source breakdown voltage. As the doping concentration of the drain region 310 becomes lower, the drain-to-source breakdown voltage of the power MOS transistor 300 becomes higher. On the other hand, smaller doping concentration gradient values exhibited by the drain region 310 correlate to higher drain-to-source breakdown voltages of the power MOS transistor 300. Accordingly, a drain region 310 with a doping concentration generally decreasing toward the deep well region 350 provides a high drain-to-source breakdown voltage. Preferably, the depth of the drain region 310 is at least 1.5 times the depth of the trench gate 320.

Figure 9:
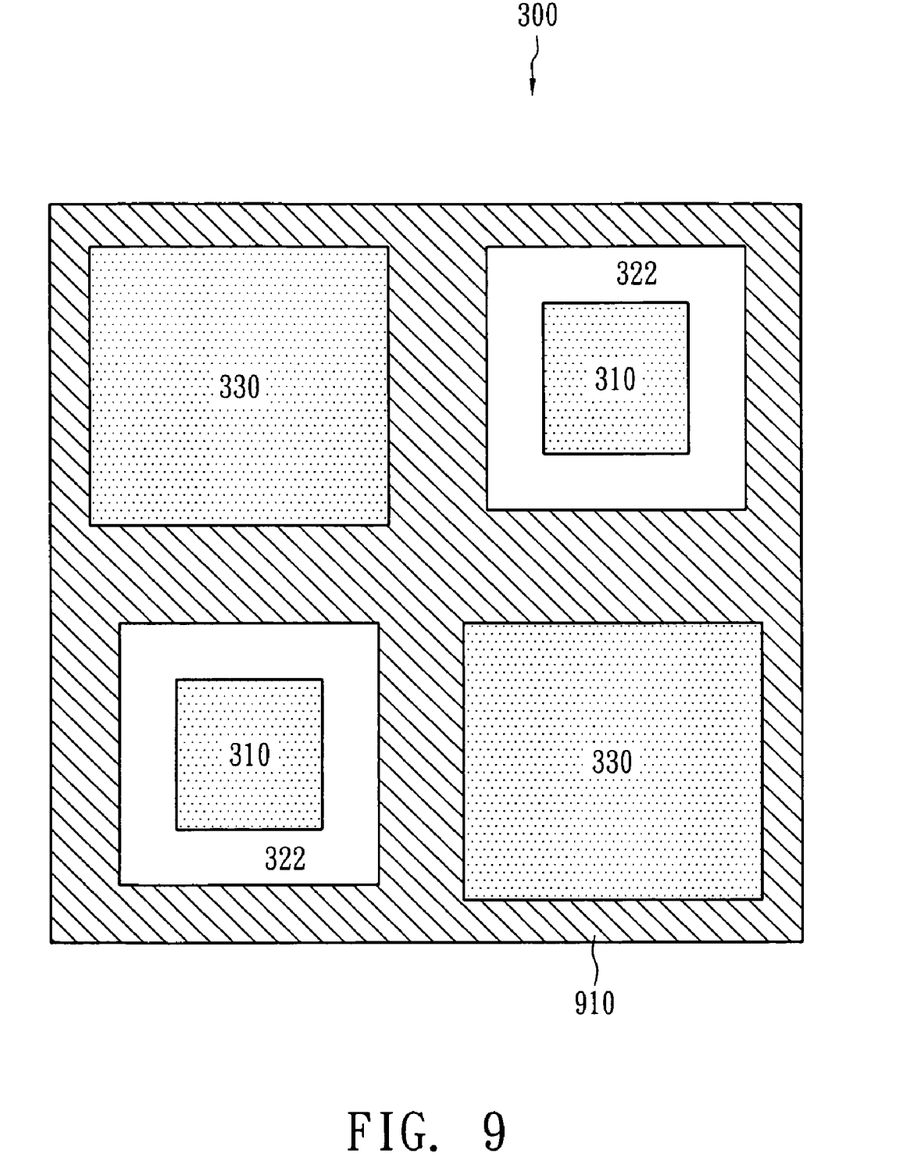
FIG. 9 shows a schematic view of the layout structure of an embodiment of the MOS transistor of the present invention.

FIG. 9 shows a schematic view of the layout structure of the power MOS transistor 300 in FIG. 3. As shown in FIG. 9, the drain region 310 is surrounded by the field oxide 322 of the trench gate 320. A gate conductor 910 connected to the poly gate 321 of the trench gate 320 separates the drain region 310 and the source region 330.

Figure 10:
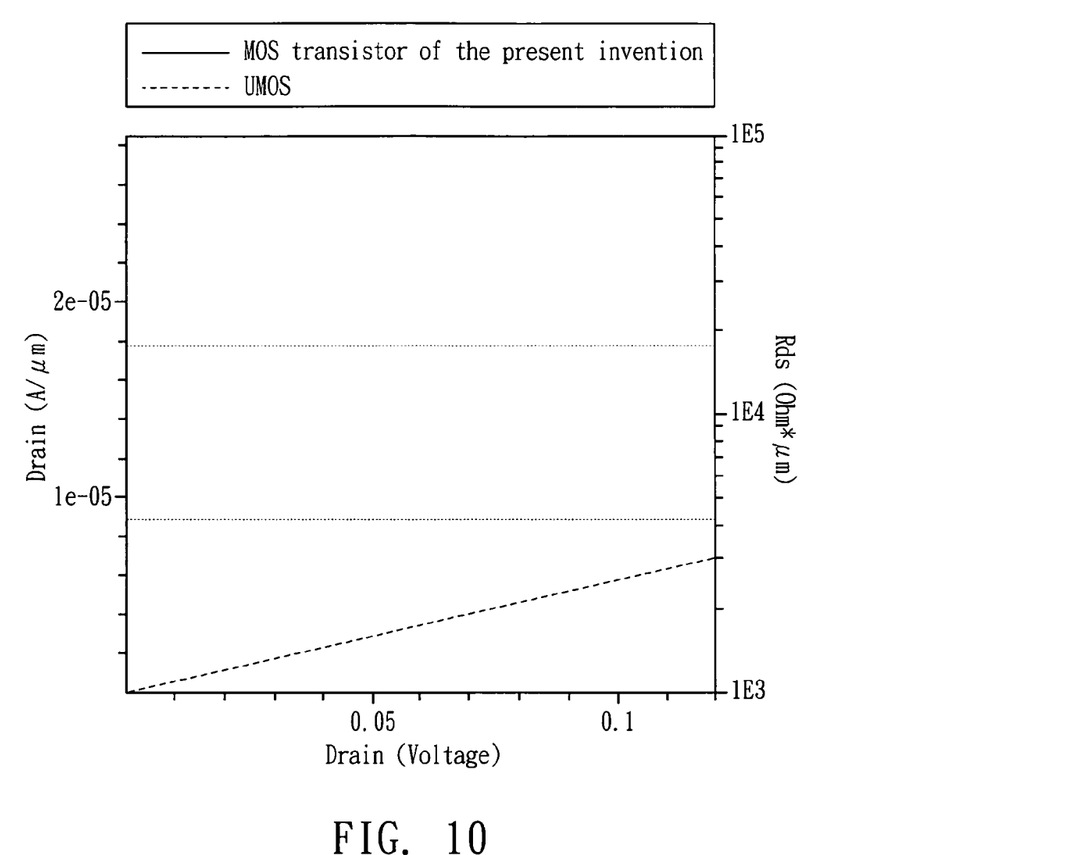
FIG. 10 shows a comparison of between a conventional UMOS transistor and a power MOS transistor according to the present invention.

FIG. 10 shows a comparison between a conventional UMOS transistor and a power MOS transistor according to the present invention. The breakdown voltage of the UMOS transistor and the power MOS transistor are both 20V. As can be seen in FIG. 10, the resistance per unit length of the UMOS transistor is approximately four times that of the power MOS transistor according to the present invention. Accordingly, the power MOS transistor according to the present invention can support current four times that of the UMOS transistor.

Figure 11:
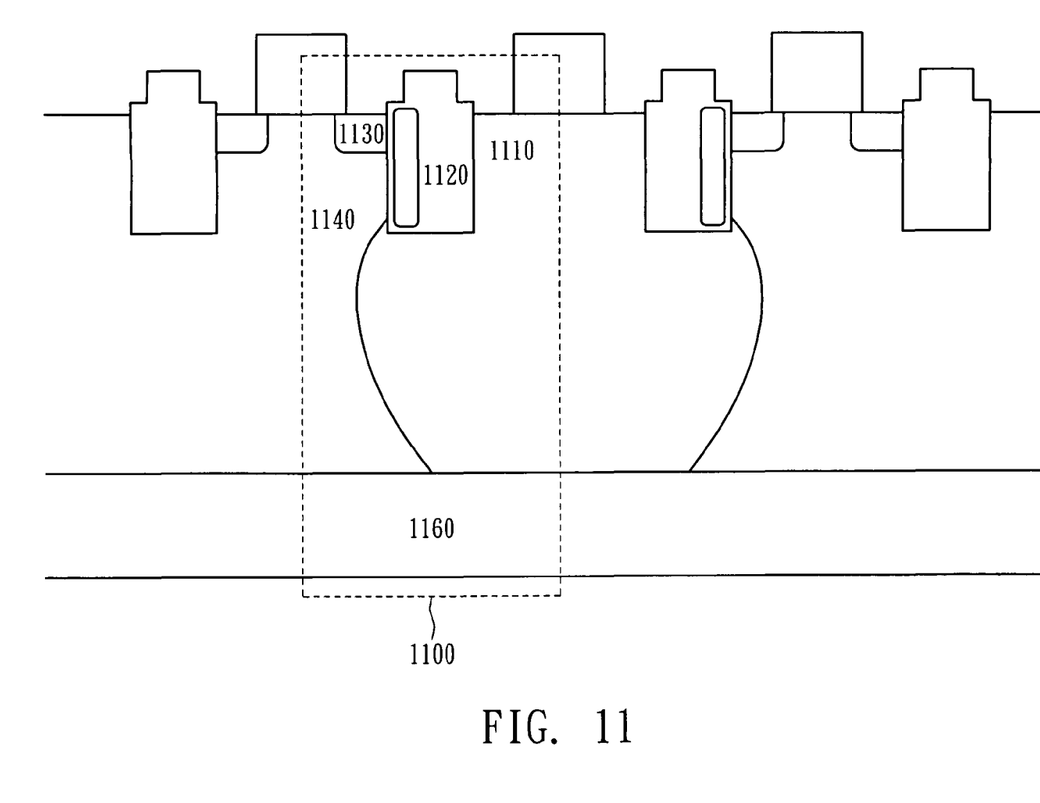
FIG. 11 shows a schematic view of an embodiment of the MOS transistor of the present invention.

FIG. 11 shows a schematic view of the power MOS transistor according to another embodiment of the present invention. The power MOS transistor 1100 comprises a drain region 1110, a trench gate 1120, a source region 1130, a well region 1140 and a substrate region 1160. As shown in FIG. 11, the power MOS transistor 1100 exhibits the same structure as the power MOS transistor 300, except that the power MOS transistor 1100 does not have the deep well region 350. Accordingly, the substrate region 1160 is floated to protect it from being shorted with the source region 1130.

Figure 12:
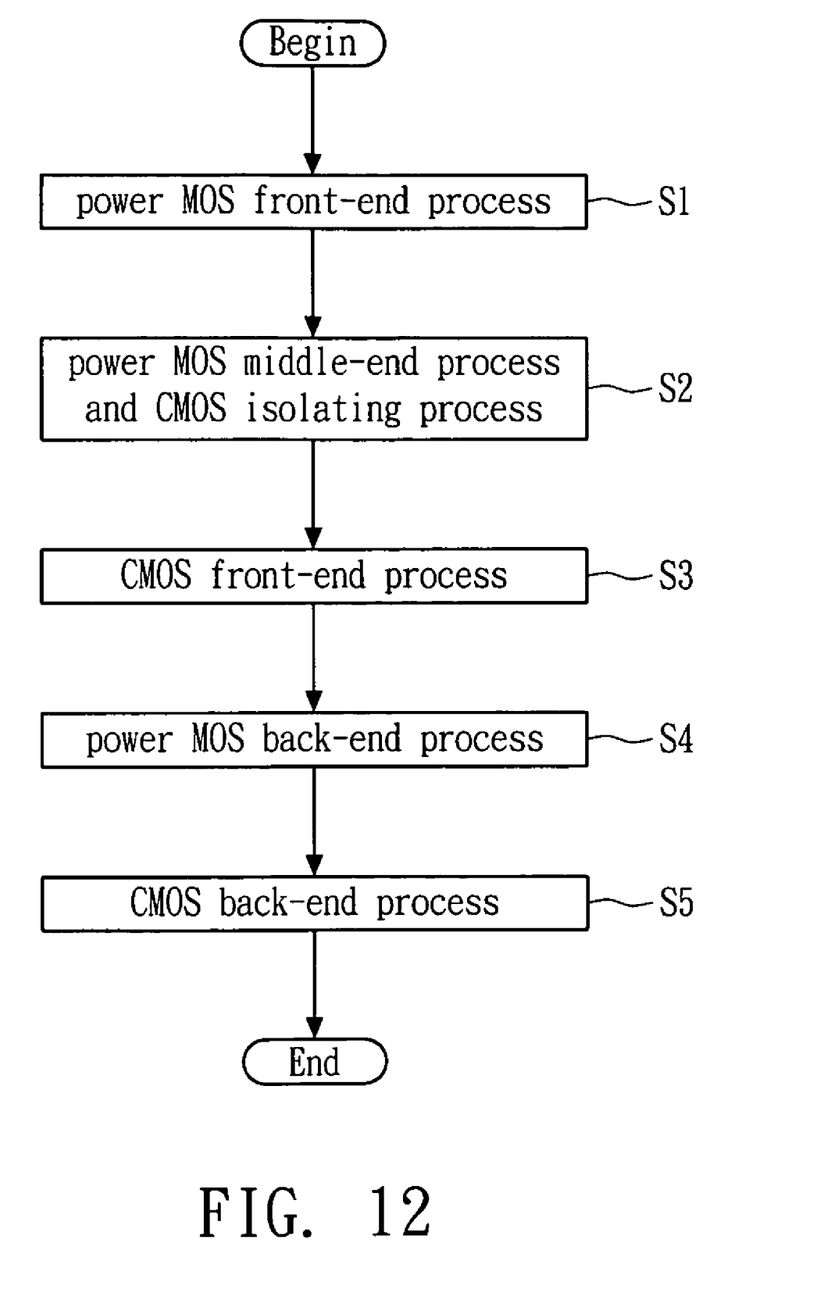
FIG. 12 shows a flow chart of manufacturing the MOS transistor 300 by CMOS process.

Due to the planer structure of the power MOS transistor of the present invention, it can be implemented in CMOS process with other CMOS transistors. FIG. 12 shows a flow chart of manufacturing the power MOS transistor 300 by CMOS process. In Step S1, the front-end process of the power MOS transistor 300 is implemented, including forming the double diffused drain structure and the deep well region 350. In Step S2, both the middle-end and isolating processes of the CMOS transistors are implemented. In Step S3, the front-end process of CMOS process is implemented, including forming well regions and gates of the CMOS transistors. The well regions of the power MOS transistor 300 and the CMOS transistors are implemented at the same time. In Step S4, the back-end process of the power MOS transistor 300 is implemented, and the forming process of the source and drain regions of the power MOS transistor 300 and CMOS transistors are also implemented. In Step S5, the back-end process of CMOS transistors is implemented.

Figure 13:
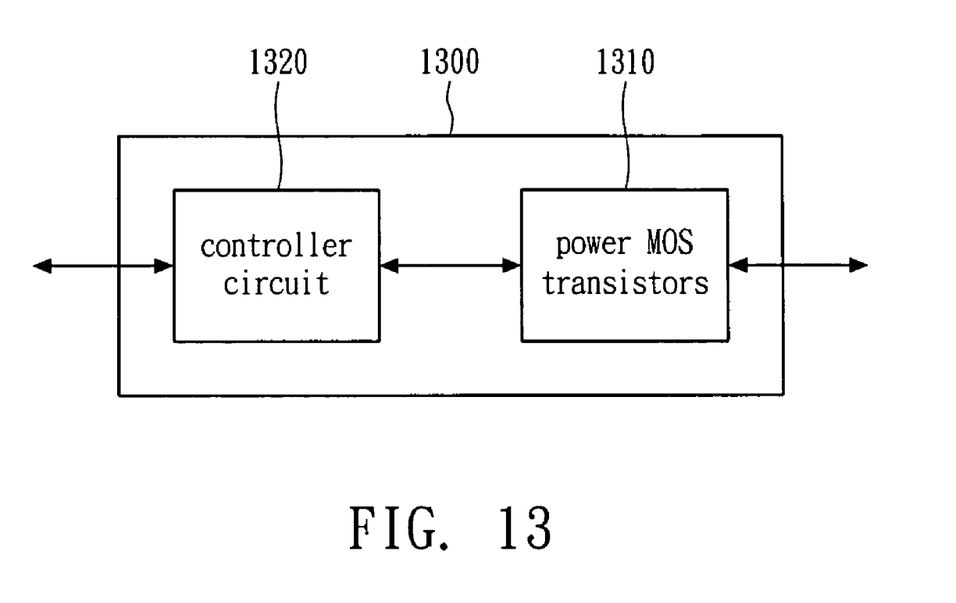
FIG. 13 shows a schematic view of an embodiment of the integrated circuit of the present invention.

FIG. 13 shows a schematic view of the integrated circuit according to one embodiment of the present invention. The integrated circuit 1300 is implemented on a single chip and comprises a power MOS transistor 1310 according to the present invention and a controller circuit 1320. The power MOS transistors 1310 provide power inputs and outputs for the controller circuit 1320. The controller circuit 1320 is implemented in the CMOS process and executes the main operation of the integrated circuit 1300.

The power MOS transistor according to embodiments of the present invention provides a high breakdown voltage and supports a high current output. The resistance induced in the epitaxial layer of conventional vertical power MOS is absent in the planer structure of the present power MOS transistor. Meanwhile, the present power MOS transistor can also be implemented in the CMOS process. Therefore, the power MOS transistor can be integrated with a well-known controller circuit in a single chip, and thus provides a very cost effective solution for any power related circuit.

The above-described embodiments of the present invention are intended to be illustrative only. Those skilled in the art may devise numerous alternative embodiments without departing from the scope of the following claims.

What is claimed is:

1. A power MOS transistor comprising:
   a drain region having a doping region of a first conductivity type connected to a drain electrode;
   a trench gate extending into the drain region, wherein the trench gate includes an insulating layer and a poly gate;
   a source region having a doping region of the first conductivity type connected to a source electrode;
   a well region with a second conductivity type formed under the source region and connected to the source electrode;
   a deep well region with the first conductivity type formed under the drain region and the well region; and
   a substrate region with the second conductivity type formed under the deep well region;
   wherein the drain electrode and source electrode are formed on the top surface of the power MOS transistor;
   wherein the drain region has a double diffused drain structure.

2. The power MOS transistor of claim 1, wherein the doping concentration of the drain region closer to the deep well region is lower than the doping concentration of the drain region farther from the deep well region.

3. The power MOS transistor of claim 1, wherein the distance between the boundary of the insulating layer close to the source region and the poly gate is smaller than the distance between the boundary of the insulating layer close to the drain region and the poly gate.

4. The power MOS transistor of claim 1, wherein the width of the trench gate ranges from 0.6 micrometer to 2 micrometer.

5. The power MOS transistor of claim 1, wherein the depth of the trench gate is 0.35 micrometer to 1 micrometer.

6. The power MOS transistor of claim 1, wherein the depth of the drain region is at least 1.5 times of the depth of the trench gate.

7. The power MOS transistor of claim 1, wherein the top surfaces of the drain and source regions are separated by a gate conductor.

8. A power MOS transistor comprising:
   a drain region having a doping region of a first conductivity type connected to a drain electrode;
   a trench gate extending into the drain region, wherein the trench gate includes an insulating layer and a poly gate;
   a source region having a doping region of the first conductivity type connected to a source electrode;
   a well region with a second conductivity type formed under the source region and connected to the source electrode; and
   a substrate region with the second conductivity type formed under the well region and the drain region;
   wherein the drain electrode and source electrode are formed on the top surface of the power MOS transistor;
   wherein the drain region has a double diffused drain structure.

9. The power MOS transistor of claim 8, wherein the doping concentration of the drain region closer to the substrate region is lower than the doping concentration of the drain region farther from the substrate region.

10. The power MOS transistor of claim 8, wherein the distance between the boundary of the insulating layer close to the source region and the poly gate is smaller than the distance between the boundary of the insulating layer close to the drain region and the poly gate.

11. The power MOS transistor of claim 8, wherein the width of the trench gate is 0.6 micrometer to 2 micrometer.

12. The power MOS transistor of claim 8, wherein the depth of the trench gate is 0.35 micrometer to 1 micrometer.

13. The power MOS transistor of claim 8, wherein the substrate region is electrically floated.

14. The power MOS transistor of claim 8, wherein the depth of the drain region is at least 1.5 times of the depth of the trench gate.

* * * * *